United States Patent [19]

Tower

[11] Patent Number: 4,647,977
[45] Date of Patent: Mar. 3, 1987

[54] CHARGE-COUPLED-DEVICE PARALLEL-TO-SERIAL CONVERTER

[75] Inventor: John R. Tower, Burlington County, N.J.

[73] Assignee: RCA Corporation, Princeton, N.J.

[21] Appl. No.: 691,534

[22] Filed: Jan. 15, 1985

[51] Int. Cl.[4] .............................................. H04N 3/14
[52] U.S. Cl. ....................................... 358/213; 357/24
[58] Field of Search .............................. 358/213, 212; 357/24 LR

[56] References Cited

U.S. PATENT DOCUMENTS 4,539,596 9/1985 Elabd .................................. 358/213

*Primary Examiner*—Gene Z. Rubinson
*Assistant Examiner*—Stephen Brinich
*Attorney, Agent, or Firm*—Joseph S. Tripoli; Allen LeRoy Limberg

[57] ABSTRACT

A CCD parallel-to-serial converter comprising two successions of charge transfer stages, recurrently side-loaded with respective ones of parallelly supplied charge packets, then serially unloaded by time-interleaved respective shift register operations. The charge packets converted to time-division-multiplexed serial form are supplied to a shared electrometer, and the electrometer response is de-multiplexed. Preferably, shift register operations are carried forward concurrently at the same rate, but with the final charge transfer stages clocked in phases staggered in time.

20 Claims, 19 Drawing Figures

CHANNEL STOP MASK

THIN OXIDE MASK

FIRST BCCD MASK

SECOND BCCD MASK

FIRST POLYSILICON LAYER MASK

SECOND POLYSILICON LAYER MASK

N + DIFFUSION MASK

SCHOTTKY CONTACT MASK

SILICON OXIDE MASK

ALUMINIZATION MASK

CHARGE-COUPLED-DEVICE PARALLEL-TO-SERIAL CONVERTER

The invention described herein was made in performance of work under NASA Contract No. NAS 5-27800 and is subject to the provisions of Section 305 of the National Aeronautics and Space Act of 1958 (72 Stat. 435; 42 U.S.C. 2457).

The invention relates to charge-coupled device (CCD) parallel-to-serial converters. The invention also relates to time-division-multiplexed electrometer arrangements for charge coupled devices, as of the type responsive to charge packets supplied parallelly in time to generate a stream of voltage or current samples serial in time. More particularly, the invention concerns CCD parallel-to-serial converters where the number of charge packets received in parallel makes the parallel-to-serial conversion with just a side-loaded CCD shift register impractical because of transfer efficiency limitations.

BACKGROUND OF THE INVENTION

In certain CCD applications it is desirable to be able to time-division multiplex several hundreds of samples supplied parallelly in time, so as to rearrange them to be serial in time. An application for such a parallel-to-serial converter that is of particular interest to the inventor is involved with the provision of line array short-wave infrared detectors for satellite cameras of the push-broom type. These line arrays are required to have resolution in the direction of line scan that involves thousands of image elements, or pixels. Infrared sensing per se is done in diode structures using platinum silicide Schottky barrier contacts to p-type silicon, with each sensor diode structure being about thirty microns square. U.S. Pat. No. 4,467,342, issued 21 Aug. 1984, to J. R. Tower and entitled "MULTI-CHIP IMAGER" teaches how to make such an ultra-long line array of large sensor diode structures, by using a plurality of semiconductor dies having disposed on them respective component line arrays of a few hundred charge transfer stages length. The dies are abutted to form the full length of the ultra-long line array of large sensor diode structures.

The use of buttable component linear arrays reduces the problem of parallel-to-serial conversion of several thousand samples to the problem of replicated parallel-to-serial conversions, each of several hundred samples. But it introduces the limitation that side-loaded CCD registers used for parallel-to-serial conversion must not extend beyond the linear arrays of photosensors they share the same semiconductor die with. This limitation can be accommodated by incorporating parallel transfer registers for connecting the photosensors to the CCD shift register they side-load, which parallel transfer registers use fan-in to cause their parallelly arrayed output ports to be narrower than their parallelly arrayed input ports.

A problem is encountered with dividing the full linear array into component linear arrays located in separate buttable semiconductor dies, such that component linear arrays are short enough to be parallel-to-serial converted without encountering transfer efficiency problems. At the 77 to 125K temperature at which the linear arrays are operated, the limitation on the number of successive charge transfers in the side-loaded CCD shift register before transfer efficiency problems become significant is around five hundred or so, for the clock-out interval contemplated (four milliseconds). If one uses a two-phase side-loaded CCD shift register for parallel-to-serial conversion, this limits shift register length to two-hundred-fifty or so stages. Limiting die width to fit one CCD shift register of such length across most of that width results in a die that is too small by present-day layout rules to accommodate a desired number of bond pads for input/output connections. So two CCD shift registers in linear alignment are to be fitted across the die width. Fitting more than two CCD shift registers in line across the length of a semiconductor die results in a die that is too large to be manufactured with acceptably high yield using present-day technology, as well as unduly increasing the number of electrometers, buffer amplifiers and bond pads on the die.

There is a problem with matching the charge-to-voltage conversion characteristics of electrometers. Some adjustments to accommodate differences in these conversion characteristics invariably must be made. Consequently, it is desirable to share the same electrometer for the two CCD shift registers in line across the width of the same semiconductor die. In order to continue to avoid the problems of transfer inefficiency caused by too many successive charge transfers, it is desirable to avoid substantial additional charge transfers in connecting the CCD shift registers to the shared electrometer.

The use of two CCD shift registers in linear alignment both connecting to a shared electrometer stage is also of interest in visible-light CCD imagers. While such imagers are normally operated around 300K, which higher temperature improves transfer efficiency, the CCD shift registers used for parallel-to-serial conversion are normally operated at a several MHz clock rate, which hampers efficient charge transfer.

SUMMARY OF THE INVENTION

The invention is embodied in CCD parallel-to-serial converter arrangements in which a parallel-transfer CCD register side-loads in parallel first and second CCD shift registers, during halts in their forward clocking. The subsequent forward clocking of the first and second CCD shift registers is done so as to interleave in time the charge packets transferred out of the registers during their respective shift register operation. The interleaved charge packets are transferred to an electrometer stage the two registers share. In preferred embodiments of the invention the first side-loaded CCD shift register and the second side-loaded CCD shift register receive forward clocking signals continuously over the same time periods, but offset in phase, whereby the electrometer is operated in time division multiplex to convert charge packets shifted out of the two registers to sets of voltage samples interleaved on a per sample basis. The two interleaved sets of voltage samples are then de-multiplexed to provide respective output voltage signals responsive to the charge packets transferred out of the first and the second side-loaded CCD shift registers. This alternate unloading of the first and second side-loaded CCD shift registers permits their forward clocking rate to be half the rate required for successively unloading them, improving transfer efficiency and reducing clocking power requirements.

DETAILED DESCRIPTION

Figure 1:
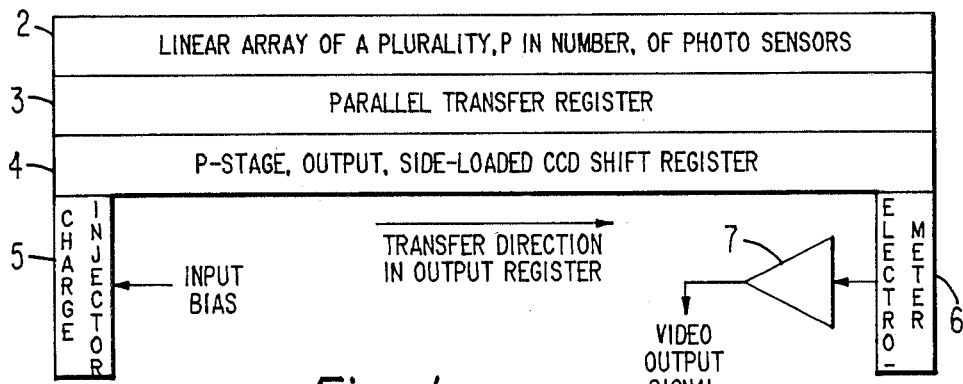
FIG. 1 is a block diagram of a prior art line array sensor.

FIG. 1 shows a prior art line array sensor. A linear array 2 of a plurality, P in number, of photosensors accumulate photocharge during image integration intervals. After each image integration interval the charge packets accumulated in each of the photosensors in the linear array 2 are transferred via respective short CCD charge transfer channels in a parallel-transfer register 3 to side-load respective ones of the successive charge transfer stages in a CCD shift register 4. Dynamic forward clocking of CCD shift register 4 is halted during this side-loading of its charge transfer stages.

CCD shift register 4 is the output register for the FIG. 1 line sensor array. In many applications, prior to being side-loaded with photocharge packets transferred to it in parallel, CCD register 4 is forward clocked to serially load bias (or "fat zero") charge packets into its charge transfer stages, which bias charge packets are supplied to its input end from a charge injector 5. The amplitude of these bias charge packets is determined by an input bias voltage applied to charge injector 5 and is adjusted to guarantee linearity in the transfer through register 4 of charge packets descriptive of image elements after their subsequent side-loading into register 4.

During image integration intervals, the output CCD shift register 4 is forward clocked (left to right in FIG. 1) to transfer serially to an electrometer 6, the charge packets that have been side-loaded into the charge transfer stages of register 4. A presently favored type of electrometer 6 is the floating diffusion type. A floating diffusion is disposed at the output end of the charge transfer channel of CCD shift register 4 and connects to the gate electrode of an insulated-gate field-effect transistor (hereinafter referred to as the "electrometer FET") operated in common-drain or common-source amplifier configuration. As shown in FIG. 1, this amplifier configuration is usually followed by another amplifier 7 located at least partially on the same semiconductor die. The floating diffusion is periodically clamped by in-channel field-effect transistor action to a reset drain at the end of the register 4 charge transfer channel, responsive to a pulse being applied to a reset gate electrode between the floating diffusion and the reset drain. This dc-restores the gate electrode of the electrometer transistor before each charge packet is introduced under the floating diffusion. Each charge packet will then induce a lowered gate voltage on the electrometer transistor, responsive to which a sample of video output signal is supplied from the output port of amplifier 7. A problem with this prior art line sensor arises when the image element size (e.g., 30 microns square) defined by individual photosensor area on the semiconductor die is small enough, across the width of the array, that several hundred photosensors are required to cross, without gaps, a die size sufficiently large on which to locate the requisite number of bond pads on the linear sensor array. (In a particular application two parallelly disposed linear sensor array segments appeared on each die, and twenty-two bond pads were needed.) Suppose by way of example the number P of photosensors is 512. Even with two-phase clocking, shift register 4 operation involves 2P=1024 charge transfers. This introduces unacceptably low transfer efficiency in the 77 to 125K temperature range, at the clocking rates used to read out such a line sensor array—e.g., 1024 charge transfers in four milliseconds.

Figure 2:
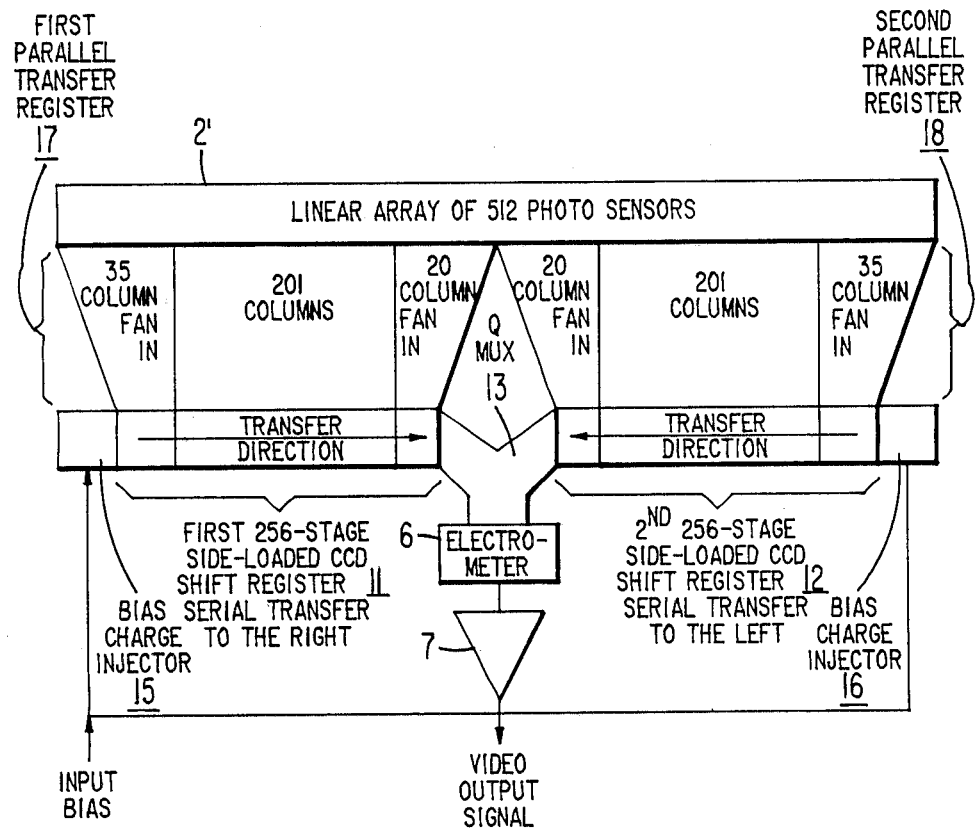
FIG. 2 is a block diagram of a line array sensor embodying the invention.

FIG. 2 shows a line sensor array, improved in accordance with the invention, and provided with a linear array 2' of 512 consecutive photosensors. Rather than one output register 4 of 512 stages, a first 256-stage side-loaded CCD shift register 11 is used for the parallel-to-serial conversion of charge packets accumulated in the left half of photosensor line array 2', and a second 256-stage side-loaded CCD shift register 12 is used for the parallel-to-serial conversion of charge packets accumulated in the right half of photosensor line array 2'. The first CCD shift register 11 is periodically forward clocked to shift charge packets to the right through a charge multiplexer 13 to the input port of electrometer 6, and the second CCD shift register 12 is periodically forward clocked to shift charge packets to the left through charge multiplexer 13 to the input port of electrometer 6. The number of charge transfers to empty an output line register 11 or 12 is half the number of charge transfers to empty an equivalent total length single output line register 4. That is, there are not substantially more than 512 charge transfers of any charge packet before it reaches electrometer 6, so one avoids charge transfer efficiency limitations having unacceptably high effects upon the relative amplitudes of charge packets reaching electrometer 6 from different photosensing sites.

The input ends of CCD shift registers 11 and 12 are shown as being provided with respective input bias charge injectors 15 and 16 for inserting fat zero bias charges. Note that the fat zero bias charges can be loaded into CCD shift registers 15 and 16 in two parallel streams of serially injected charge packets, reducing by half the time required for introducing bias charge packets at given rate into all output register charge transfer stages.

A first parallel-transfer register 17 is used for transferring charges in parallel from the 256 photosensors in the left half of line array 2' to corresponding ones of the 256 stages in CCD shift register 11. It is desirable to make CCD shift register 11 narrower than half the width of line array 2'. So as to leave room on the die for charge injector 15, the first thirty-five columns of parallel-transfer register 17 fan-in. That is, the charge transfer channels defining these thirty-five columns are narrower at their output port connections (to side-load respective charge transfer stages of CCD shift register 11) than these charge transfer channels are at their input port connections from respective photosensors in line array 2'. The charge transfer channels defining the 201 columns roughly in the middle of parallel-transfer register 17 are constant-width. The charge transfer channels defining the remaining twenty rightmost columns in parallel-transfer register 17 fan in to open room for charge multiplexer 13. The pitch of the fifty-five charge transfer stages side-loaded by charge packets from the fanned-in columns of parallel transfer register 17 is shortened compared to the pitch of the remaining 201 charge transfer stages, of course.

The second CCD shift register 12, and the second parallel-transfer register 18 used to transfer charges from the right half of photosensor line array 2' to respective charge transfer stages of register 12, mirror in their construction first CCD shift register 11 and first parallel-transfer register 12. (To accommodate the columnar fan-ins, the number of successive charge transfer stages in each of parallel-transfer registers 11 and 12 may be somewhat larger than the number of successive charge transfer stages customary in parallel-transfer register 3.)

The details of the charge multiplexer 13 and how electrometer 6 is associated therewith will be disclosed later on in the specification. But before this, it should be noted that the type of parallel-to-serial converter thusfar described specifically with regard to a linear sensor array is more generally useful, specifically in connection with several different types of solid-state imager.

Figure 3:
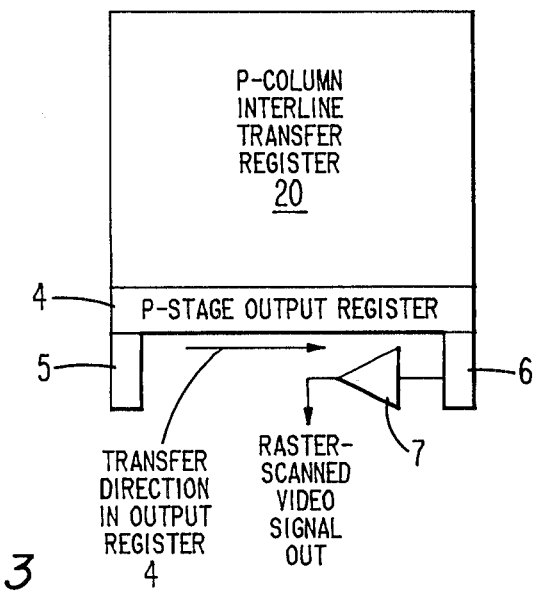
FIG. 3 is a block diagram of a prior art interline-transfer type CCD imager.

FIG. 3 shows a prior art CCD imager of the interline transfer type. Its P-column interline transfer register 20 has a plurality, P in number, of side-loaded CCD shift registers disposed parallelly from top to bottom in the register. These columnar shift registers are masked from irradiation and spaced apart to permit intervening columns of photosensors to be disposed on the gate-electrode surface of the semiconductor die, to be irradiated from that "front" side of the die. The photosensors are in an area array, and are used to generate samples of a raster-scanned video signal. The charge packets accumulated in them responsive to the intensity of respective elements of the radiant energy image irradiating the array are, during each field retrace interval, transferred in parallel to side-load respective charge transfer stages in the column CCD shift registers. During each ensuing field trace interval, then, the charge packets in the P column CCD shift registers in interline transfer register 20 are advanced a row at a time during line retrace to side-load the P-stage output CCD shift register 4. Register 4 is then forward clocked at the image element scan rate during line trace interval to supply the row of charge packets serially to electrometer 6. Electrometer 6 responds to supply samples of raster-scanned video signal to amplifier 7, which responds to supply the FIG. 3 imager video output signal.

Figure 4:
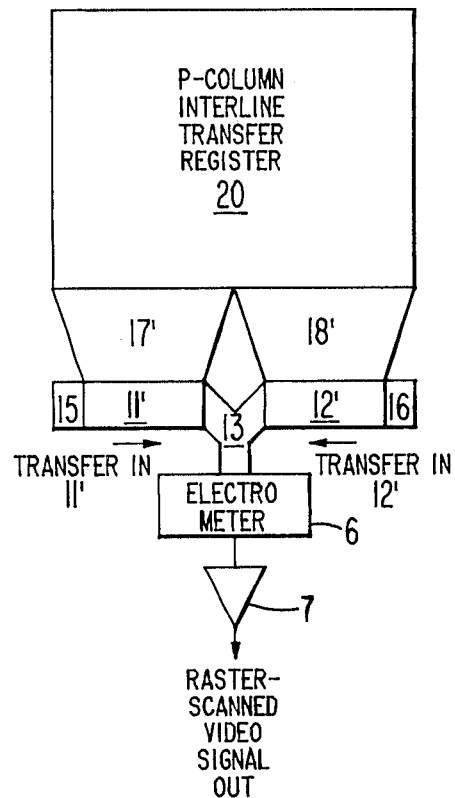
FIG. 4 is a block diagram of an interline transfer type CCD imager embodying the invention.

FIG. 4 shows how the interline transfer type of CCD imager shown in FIG. 3 is modified in accordance with the invention. The parallel-to-serial converter comprising elements 4, 5, 6 and 7 in FIG. 3 is replaced by a parallel-to-serial converter comprising elements 6, 7, 11', 12', 13, 15 and 16 essentially like the parallel-to-serial converter of FIG. 2 comprising elements 6, 7, 11, 12, 13, 15 and 16.

Figures 5, 6:
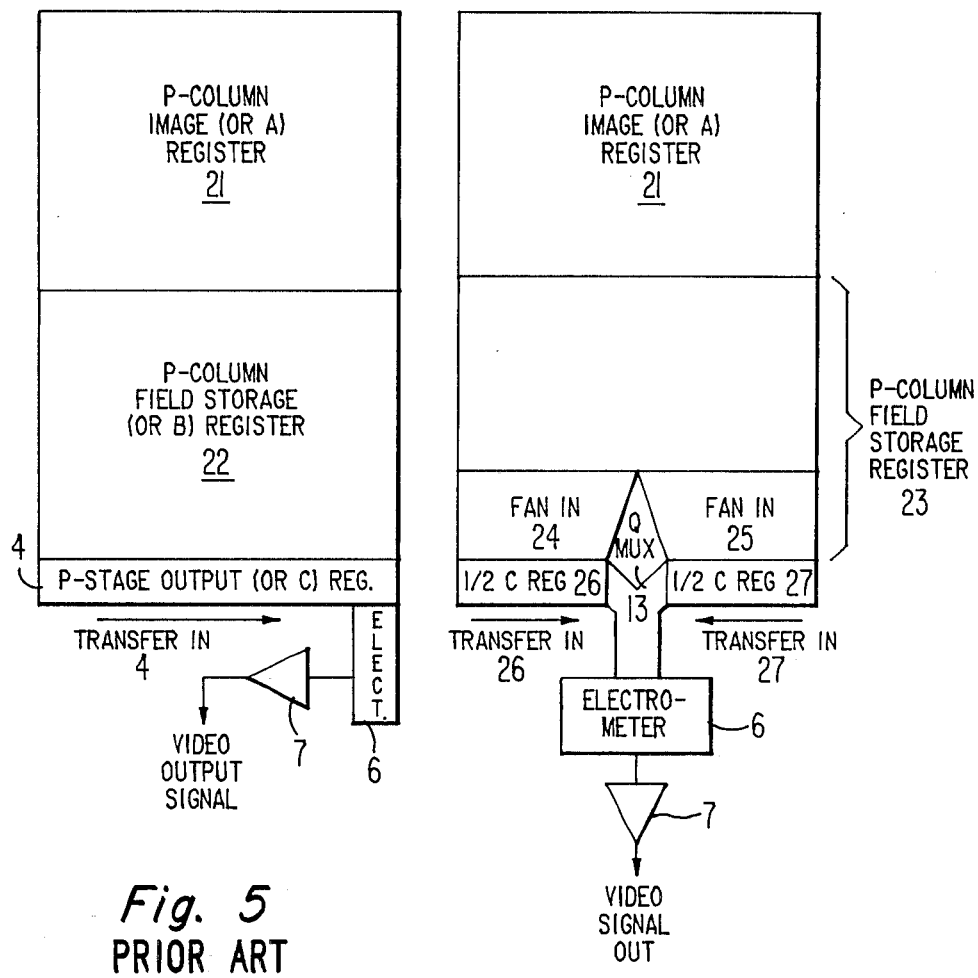
FIG. 5 is a block diagram of a prior art field-transfer type CD imager.
FIG. 6 is a block diagram of a field-transfer type CCD imager embodying the invention.

FIG. 5 shows a prior art CCD imager of the field transfer type, which also generates samples of raster-scanned video output signal descriptive of a radiant energy field image. The FIG. 5 imager has an image (or A) register 21 comprising a plurality P of parallel CCD shift registers, in the charge transfer stages of which photoconversion of a radiant energy field image takes place during image integration intervals. During the image integration intervals, which normally take place during respective field trace intervals, dynamic clocking of the CCD shift registers in image register 21 is suspended. During a portion of each field retrace interval the CCD shift registers in image register 21 are dynamically clocked, to transfer the field of charge packets accumulated in their charge transfer stages to the charge transfer stages of further CCD shift registers connected in cascade after the CCD shift registers in image register 21. These further CCD shift registers are clocked in synchronism with the CCD registers of image register 21 during this field transfer. The plurality of P parallelly disposed further CCD shift registers are shielded from irradiation and together comprise a field storage (or B) register 22. During each field trace interval, then, operation proceeds as follows. During each line retrace, the field storage register is forward clocked to advance by one row all the stored charge packets therein, the row of charge packets descriptive of a line of video signal samples being side-loaded into P-stage output CCD shift register 4. During line trace, CCD shift register 4 is forward clocked at image element scan rate to advance serially to electrometer 6 the P charge packets, which were loaded into the stages of register 4 during the previous line retrace. Conversion to output video signal is similar to that in the FIG. 3 interline transfer CCD imager.

FIG. 6 shows how the field transfer type of CCD imager shown in FIG. 5 is modified in accordance with the invention. P-column field storage register 22 of the FIG. 5 prior art imager is replaced by P-column field storage register 23 differing from register 22 only in that bottom portions 24, 25 thereof have fanned-in columns to open up room for charge multiplexer 13 between the two half-line output (½C) registers 26 and 27. (Where bias charge injectors are used at the input ports of registers 26 and 27, the portions 24, 25 of field storage register 23 may have the column registers on both sides fanned in.)

The invention may also be used with line transfer imagers to replace the side-loaded output register used for removing selected lines of charge packets to the electrometer.

A number of techniques were considered for center-tapping the output line register to the electrometer in connection with the development of a line sensor array as shown in FIG. 2 having a thirty micron pitch in its output register halves 11 and 12. The first technique considered is the use of right angle turns of the charge transfer channels coming out of the output line registers, using straightforward gate electrode clocking. With the parallel-transfer registers 17 and 18 on one side of the output register halves 11 and 12, the gate electrodes of the parallel-transfer registers 17 and 18 make it difficult to introduce clock signal bussing from that one side of the output register halves 11 and 12 unless multiple metalization layers are used. But the clocking signals for the right angle turns come from that side of the output register halves 11 and 12, because clock signal cannot be introduced into the interior angles of the right angle turns.

The second center-tapping technique considered is to use a resistive-gate right-angle charge transfer channel turn. Charge transfer over extended distances around the turns would be accomplished by inducing drift fields around the turns by applying differential voltage to the ends of polysilicon transfer gates overlapping the turns. The reliability of this technique is suspect with the layout constraints imposed by the thirty micron output register pitch.

The third center-tapping technique considered is the corner diffusion technique which utilizes ohmic connection between two N+ diffusions located respectively in the output end of a first charge transfer channel separated from each other by 1 to 15 mils. This technique unfortunately exhibits low transfer efficiency for smaller charge packets.

The fourth center-tapping technique considered is that in which each of the output register halves 11 and 12 was shortened from thirty micron pitch to twenty-nine micron pitch in its final twenty charge transfer stages. This permits room for two successive quarter-radian bends out of each register half, rather than having to use just one half-radian, or right-angle, bend. Space is opened on the exterior sides of the bends for ohmically contacting gate electrodes over the bends. The fourth approach appeared best and was chosen for use in a CCD linear photosensor array being constructed for NASA.

Figure 7:
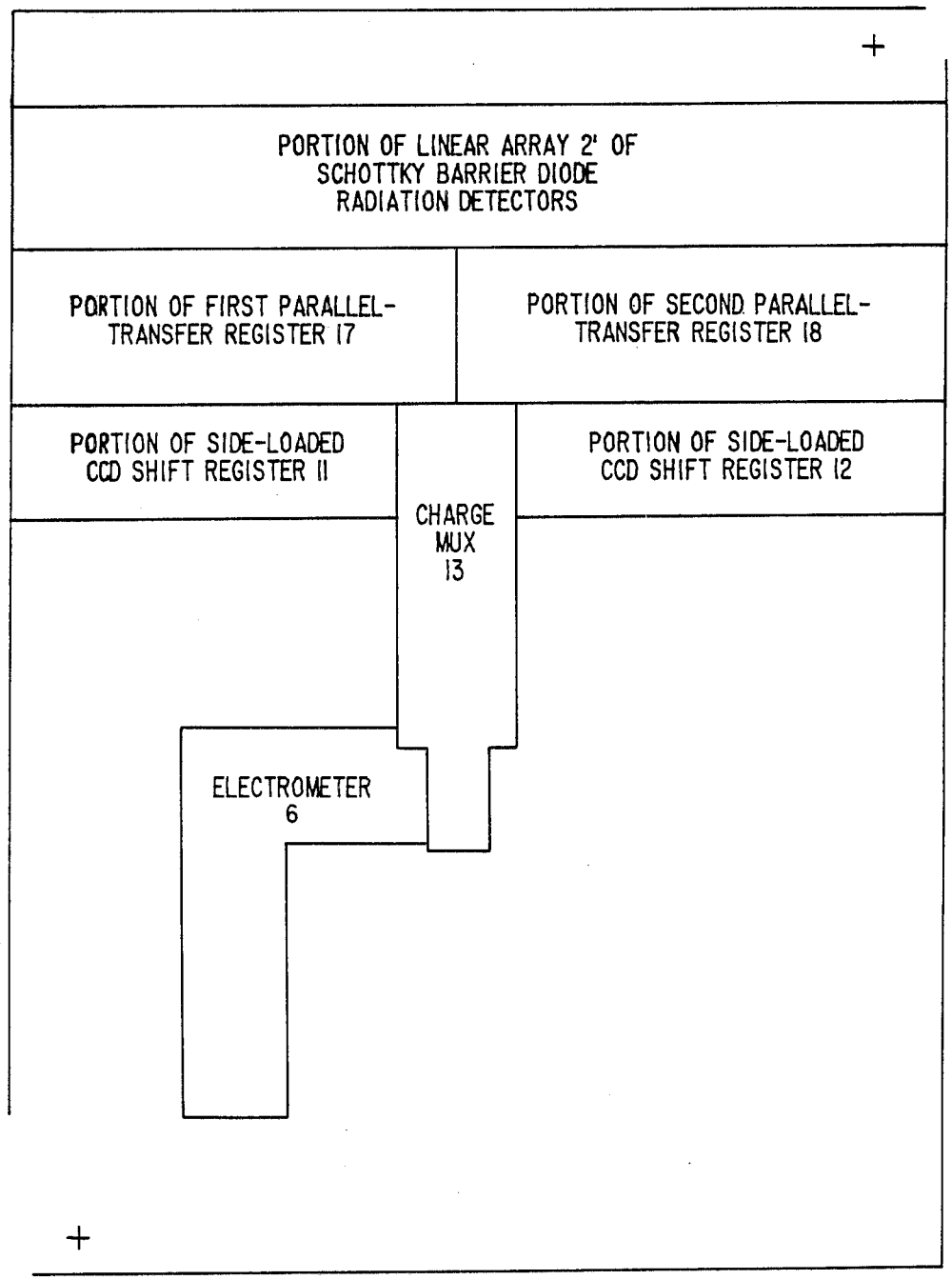
FIG. 7 is a block diagram layout of an area on a CCD line array photosensor die showing photosensor sites near the center of the line array, fan-in portions of the dual parallel transfer registers, dual output registers, and time-division-multiplexed electrometer. This apparatus embodies the invention.

FIGS. 8–17 are reproductions of hard-copy from an Applicon computer of the various process step masks used in constructing the center-tapped output register for the NASA CCD linear photosensor array. These can be reproduced as transparencies and overlaid on FIG. 7 in order of their ordinal numbering. A complete depiction of the central portion of the imager, which is of interest with regard to the invention, will thus be obtained, with FIG. 7 indicating generally what the overlying structure does.

Figure 8:
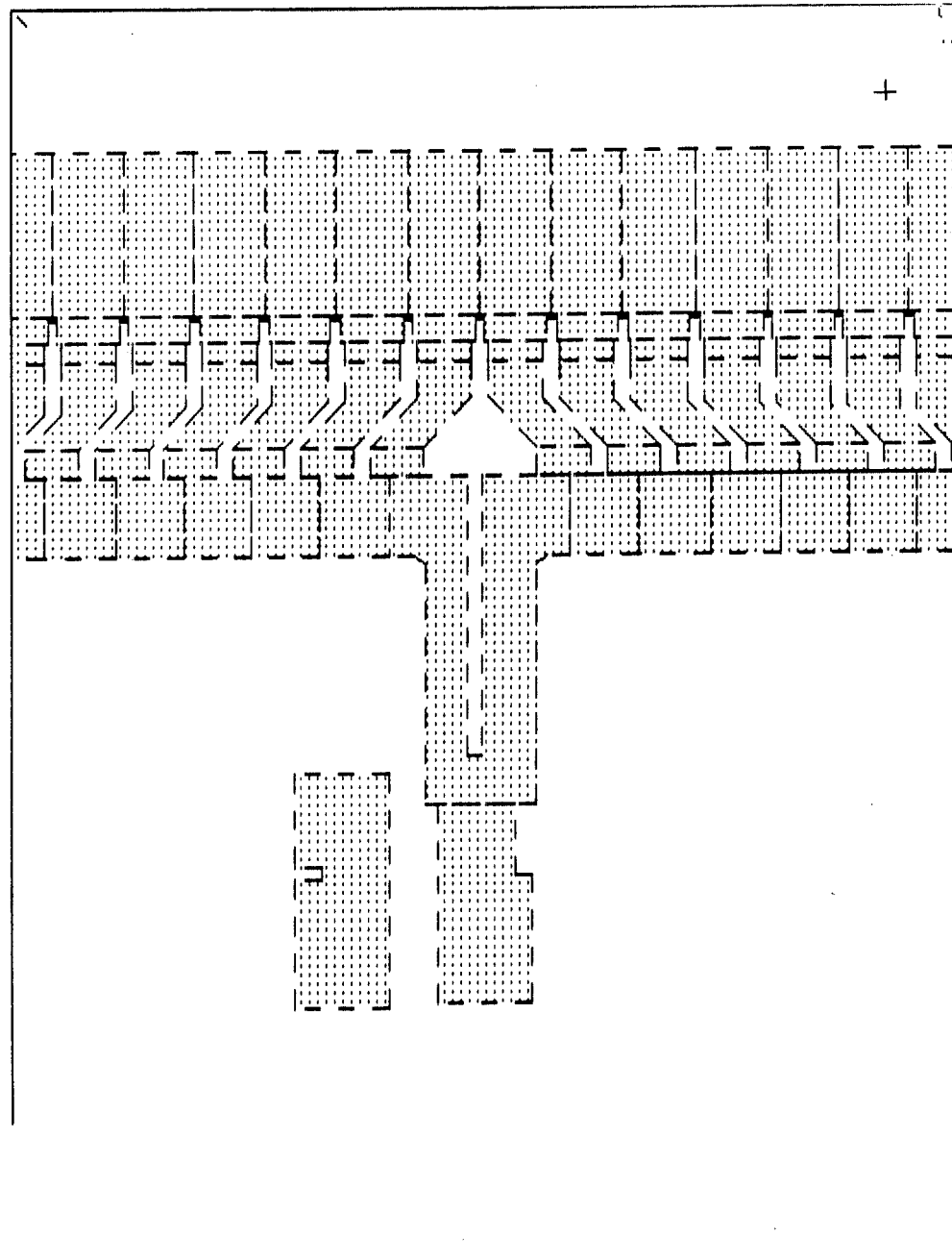
FIGS. 8–18 are reproductions of hard-copy from an Applicon computer depicting the mask set for constructing a CCD line array photosensor die embodying the invention. It is not possible to make a readily intelligible drawing of this apparatus in one figure. It is suggested that the reader make different color transparencies of these figures and successively superpose them on FIG. 7, with the aid of the cruciform alignment keys near the upper right and lower left corners of these figures. One will then obtain a "three-dimensional" view of the apparatus, superposed over the FIG. 7 block diagram that broadly identifies the various portions of the apparatus.
Figure 9:
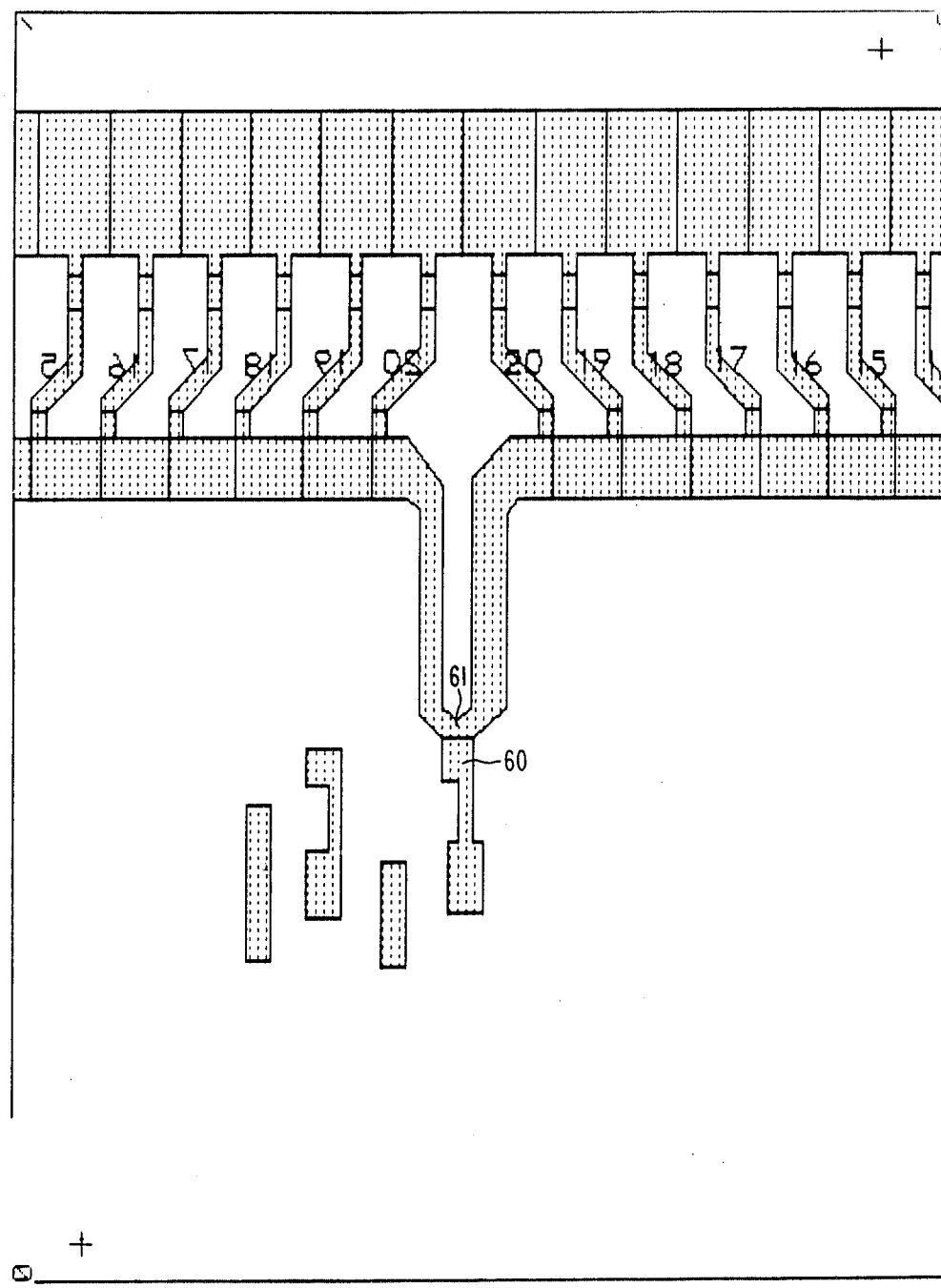

The process steps are essentially conventional for this type of imager. FIG. 8 is the mask for placement of P+ channel stops in the P-type substrate. After placement of P+ channel stops, a thick top-surface oxide is grown from an oxidizing atmosphere. FIG. 9 is the mask for thinning this oxide over the charge transfer channels.

Figure 10:
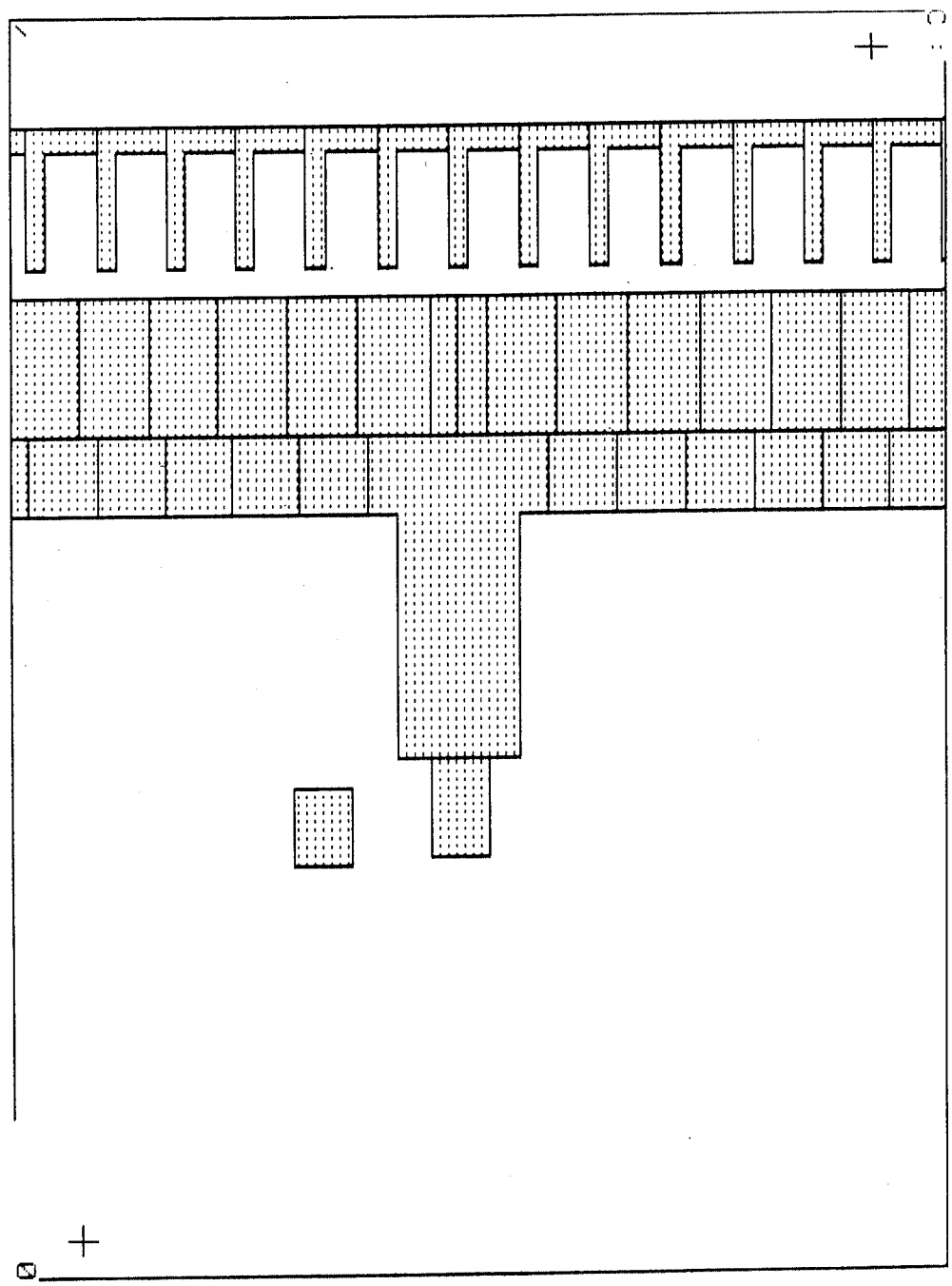
Figure 11:
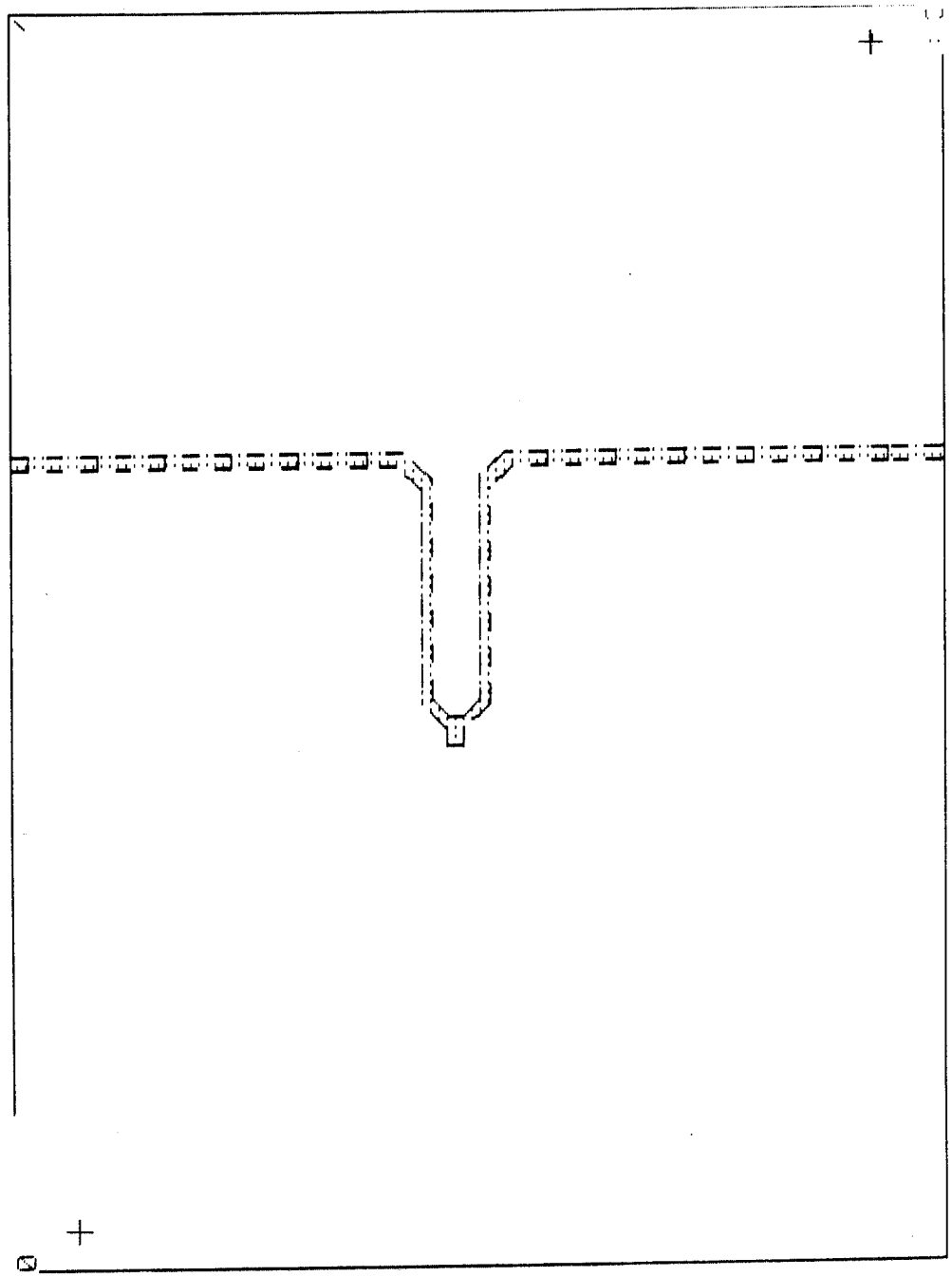

The dot-stippled areas are thinned to define, in conjunction with the P+ channel stops, the locations of the various charge transfer channels on the substrate. FIG. 10 is the mask for a first BCCD, or buried channel charge-coupled device, ion implant of n dopant. This implant also defines the n-type guard rings for the Schottky barrier diodes and the N insolation boat (or tub) for the electrometer 6 FET. FIG. 11 is the mask for a second BCCD ion implant of N dopant, which deepens the central portions of the buried channels of output registers 11 and 12. This step, which is a departure from conventional processing, is done to improve the transfer efficiency for smaller charge packets. The technique and structure is described in detail by W. F. Kosonocky in his U.S. patent application Ser. No. 653,565 filed 24 Sept. 1984, entitled "CHARGE-COUPLED DEVICE CHANNEL STRUCTURE", and assigned to RCA Corporation.

Figure 12:
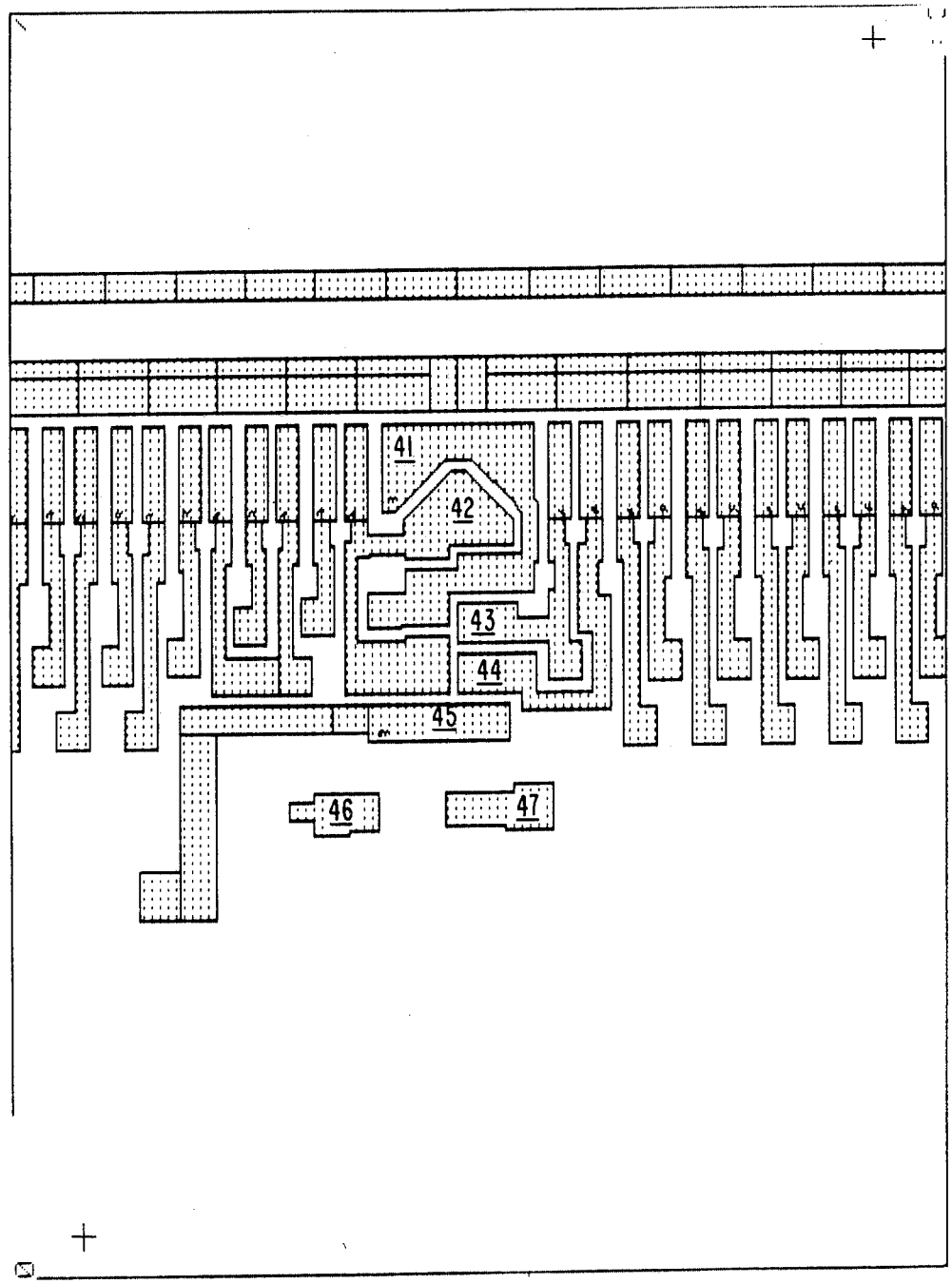
Figure 13:
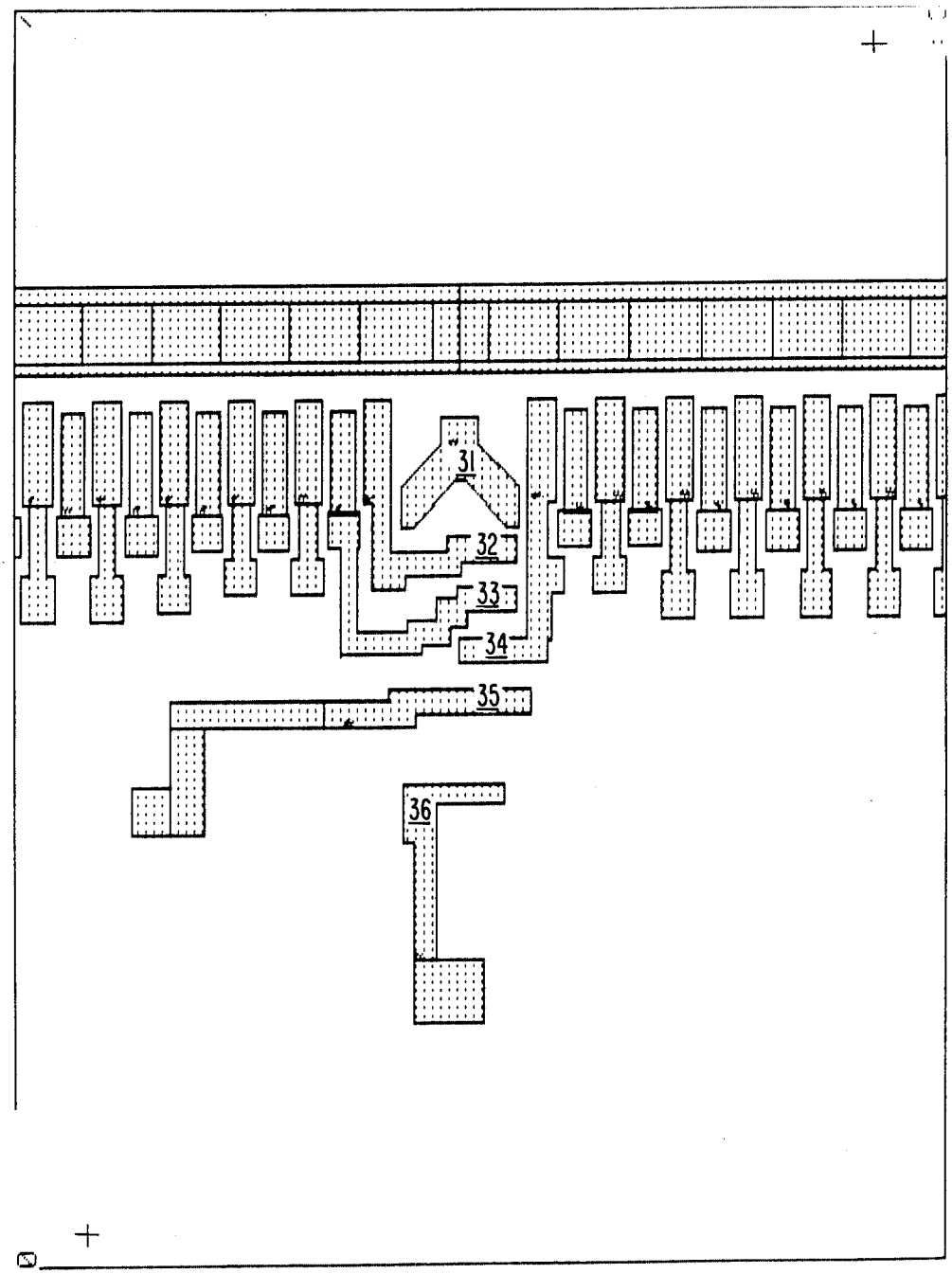

FIGS. 12 and 13 are the masks for the selective photo-etching of first and second insulated layers of polysilicon subsequently grown in succession on the top-surface of the P-type substrate. The dot-stippled portions of these masks define the gate electrode structures left after the selective photo-etching processes. When two-phase output register clocking is employed, the first-polysilicon-layer gate electrodes are used as storage electrodes and the second-polysilicon-layer gate electrodes are used as transfer electrodes. Certain features of these masks are of particular interest with regard to the invention, as will be described in detail later on in this specification.

Figure 14:
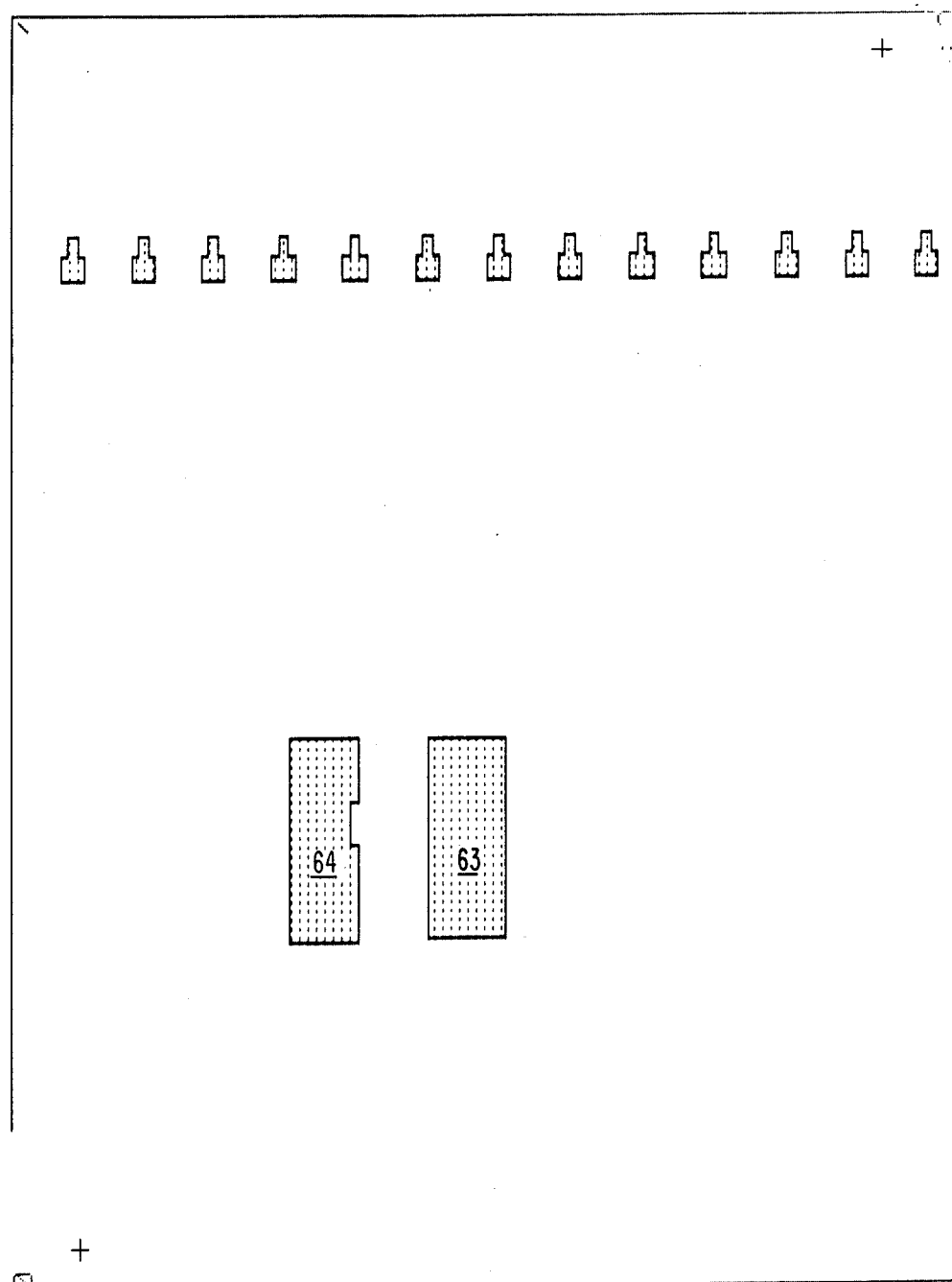

FIG. 14 is the mask for the N+ diffusions. Those N+ diffusions in the upper portion of FIG. 14 are to be used for ohmically contacting the platinum silicide or palladium silicide, "metal" portion of the Schottky-barrier-diode (SBD) photosensors. The N+ diffusion 64 towards the lower left portion of FIG. 14 establishes the source and drain electrodes of the electrometer 6 FET in a self-aligned fabrication process, and the N+ diffusion 63 towards the lower right of FIG. 14 establishes the floating diffusion and reset drain in the self-aligned fabrication process.

Figure 15:
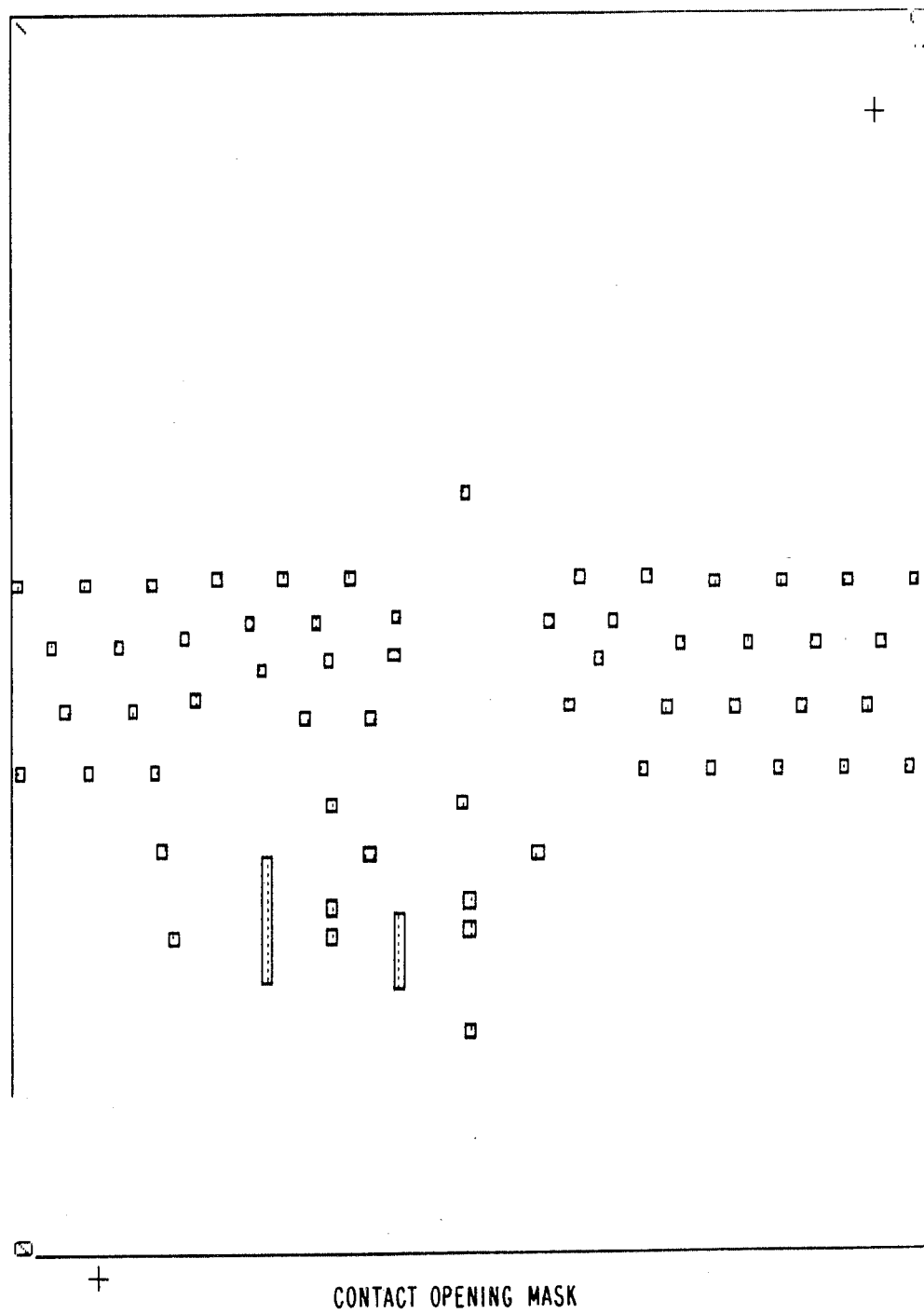

FIG. 15 is the mask for contact openings in the top oxide of the imager as thusfar constructed. The area 60 defines the charge transfer channel in which the floating diffusion is disposed, which follows charge transfer channel merger 61 of the two preceding charge transfer channels.

Figure 16:
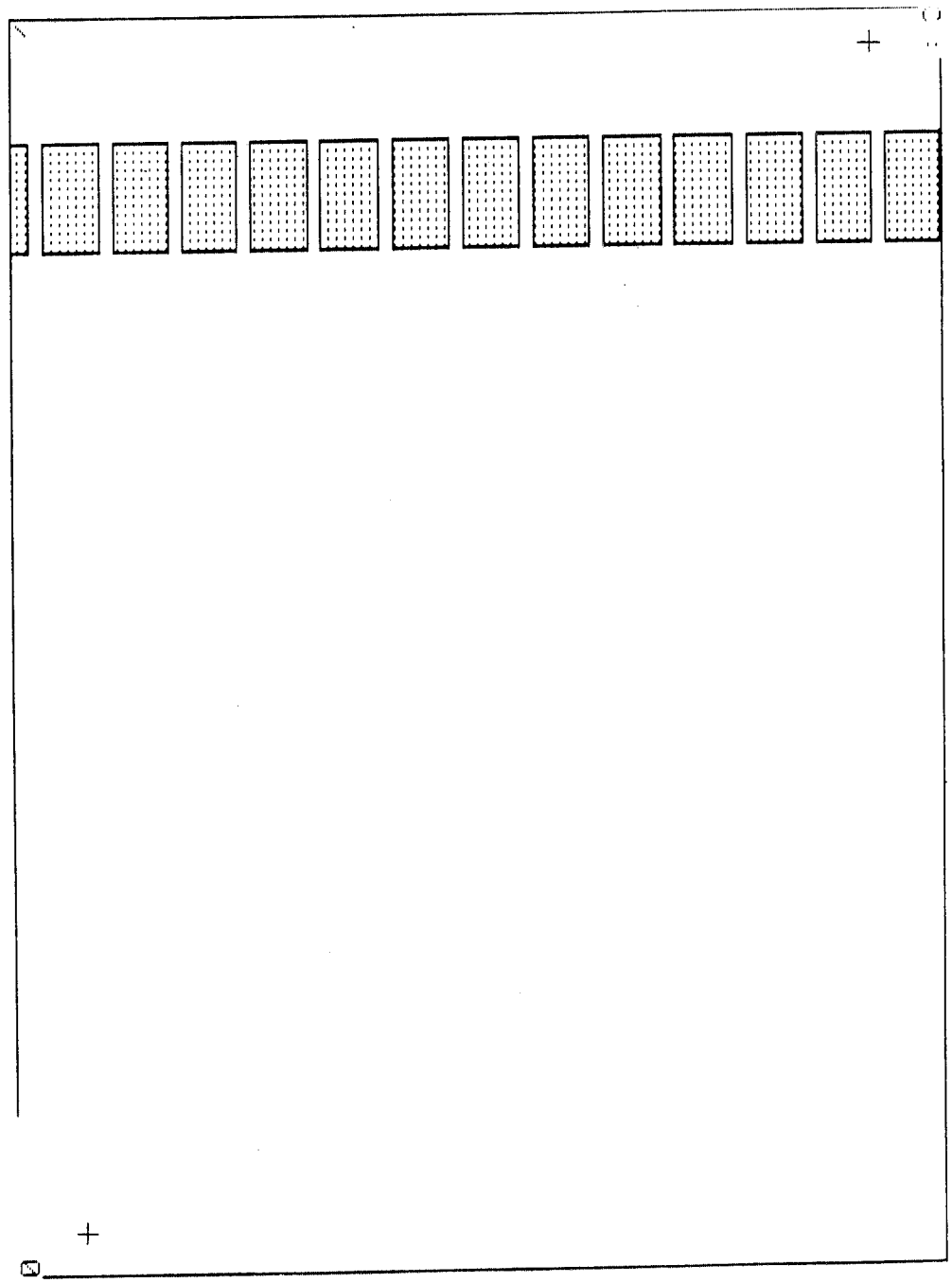
Figure 17:
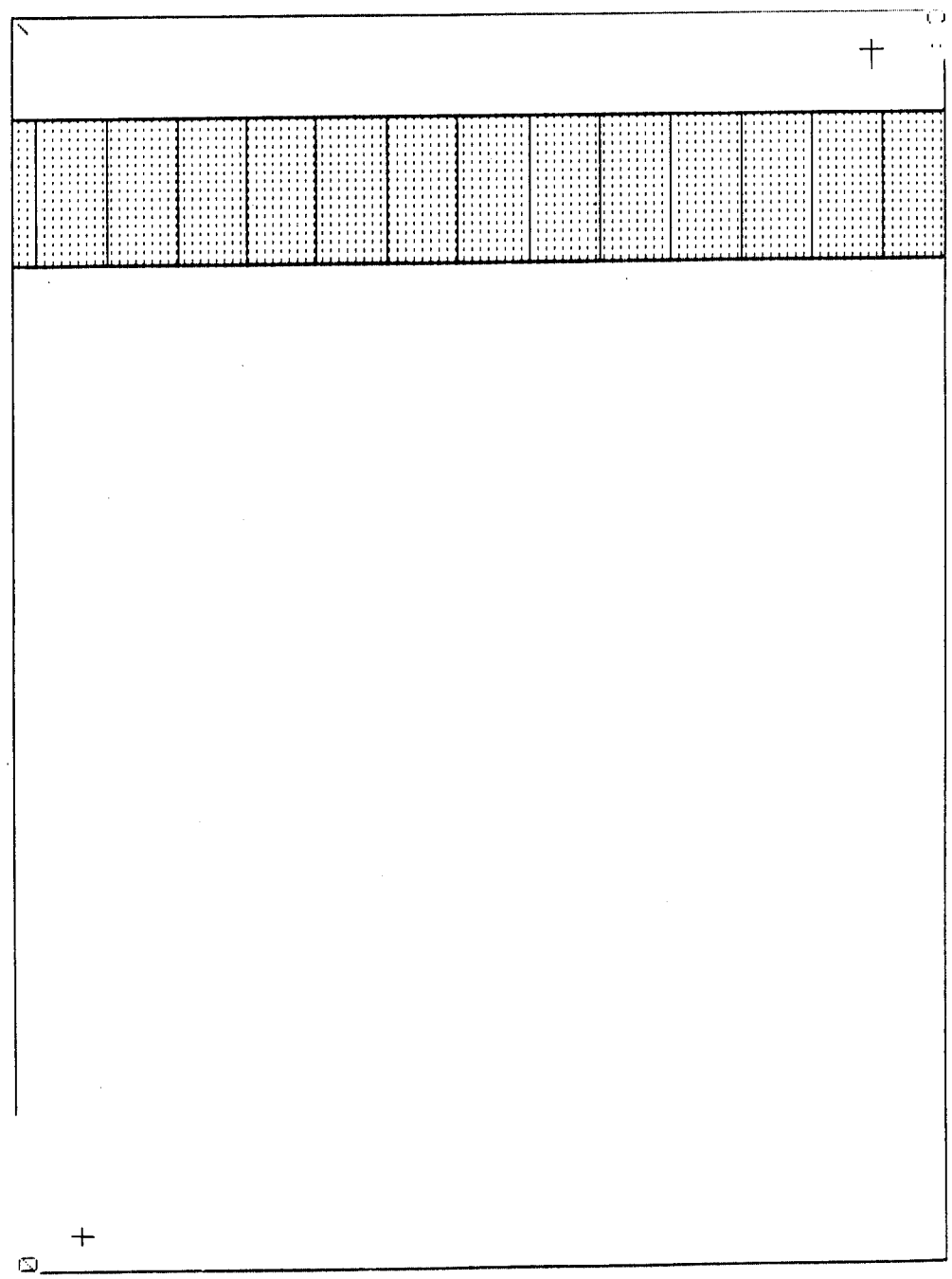
Figure 18:
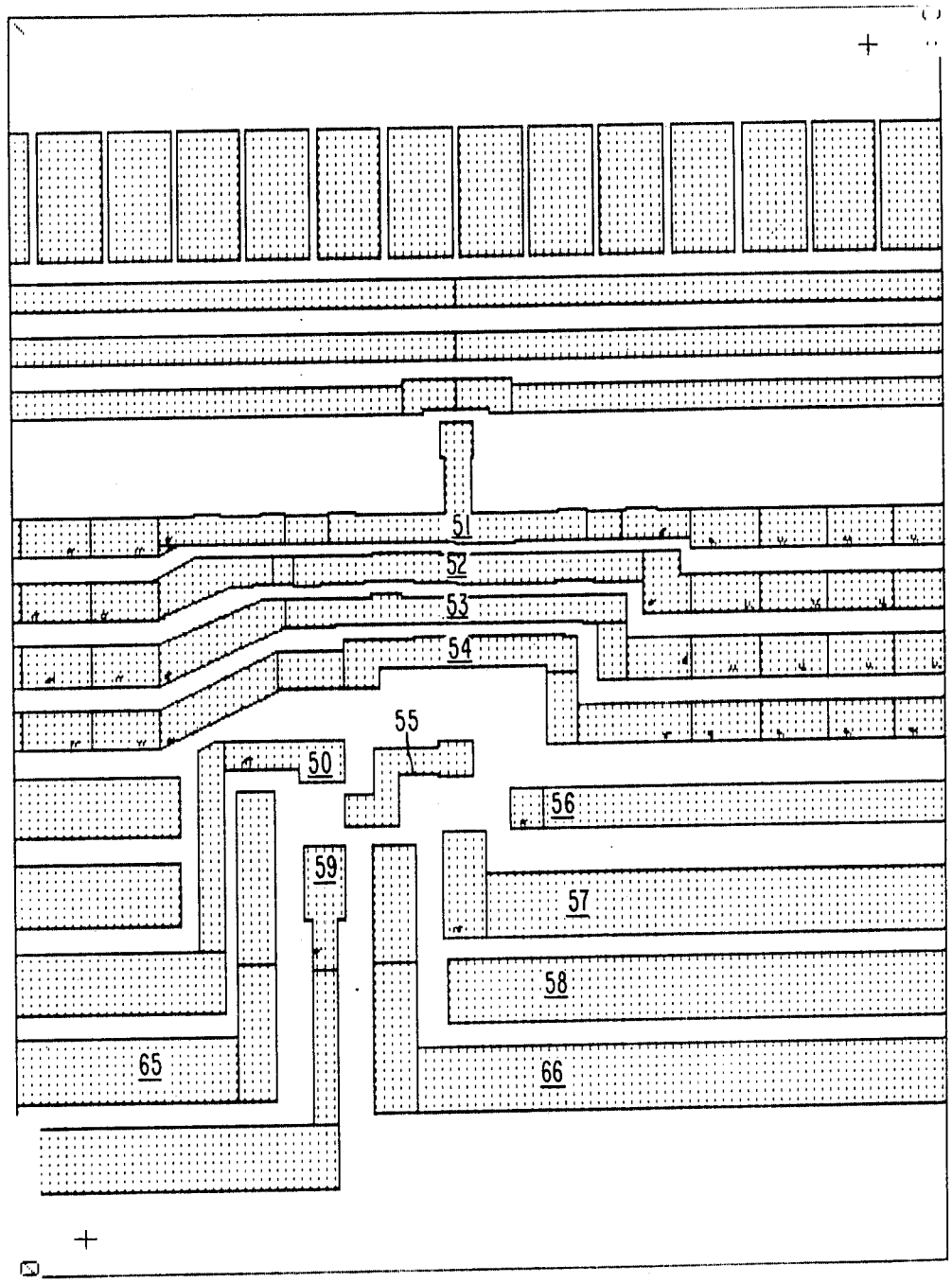

FIG. 16 is the mask for the platinum silicide metal electrodes of the SBD's. FIG. 17 is the mask for the silicon oxide insulation over the SBD metal electrode. FIG. 18 is the mask for the top aluminization, which includes bond pads not shown. A cap oxide is grown; and bond pad contact openings are made using a mask, not shown, to complete the die for encapsulation.

The features of the charge multiplexer 13 and its associated elements which are of primary interest to the invention can be discerned by simply referring to the thin-oxide mask of FIG. 9, which indicates where the buried charge transfer channels repose; the first and second polysilicon layer masks of FIGS. 11 and 12, which show the gate electrode structures overspanning the buried charge transfer channels; and the aluminum top-metalization mask of FIG. 18, which shows electrical bussing to the various imager components. It will be noted that four aluminum busses 51, 52, 53 and 54 shown in FIG. 18 permit applying clocking signals to the polysilicon gate electrodes shown in FIGS. 12 and 13 either in two phases or in four phases. By way of example, busses 51, 52, 53 and 54 may respectively receive first-phase transfer gate clock voltage, second-phase transfer gate clock voltage, second-phase storage gate clock voltage, and first-phase storage gate clock voltage respectively. Note charge transfer is to the right in output register half 11 and to the left in output register half 12.

The thin oxide mask of FIG. 9 reveals that the charge transfer channel widths in charge multiplexer 13 differ from each other and from the charge transfer channel width in the side-loaded CCD shift registers 11 and 12. This is done to maintain substantially constant charge packet storage capacity through these charge transfer channels despite variations in the lengths of the storage gate electrodes overspanning these channels.

A particular feature of interest is the inverted -Y-shaped second-polysilicon-layer transfer gate electrode 31 shown in FIG. 13. The arms of this electrode extend over 45° bends in the charge transfer channels coming out of output register halves 11 and 12, as can be seen referring FIG. 13 to the thin-oxide mask of FIG. 9. The leg of the transfer gate electrode 31 is available for being contacted by a portion of the same top-aluminization bus 51 (shown in FIG. 17) that connects to alternate ones of the transfer gate electrodes in the output register halves 11 and 12, a portion jutting upward from the center of the bus. So transfer gate electrode 31 is contacted from the outside of the transfer channel bends following output register halves 11 and 12, obviating a portion of the contact-crowding problem associated with contacting from the inside of the bends.

The structure of the portions of the first-polysilicon-layer storage gate electrodes 41 and 42 in the bends, as shown in FIG. 12 is also of interest. Gate electrodes 41 and 42 are gerrymandered so they can be side-contacted on the vertical portions of the two charge transfer channels in charge multiplexer 13. Note also the gerrymandered stages of first-polysilicon-layer electrodes 43 and 44. Gate electrode 45 disposed in the first polysilicon layer is a second of two dc-biased potential gate electrodes preceding the floating diffusion (60 in FIG. 10).

The first of these two dc-biased electrodes is gate electrode 35 in the second polysilicon layer, depicted in FIG. 13. Note, by comparing FIGS. 12 and 13 to FIG. 9, that these two dc-biased electrodes 35 and 45 overlap the crotch of the merging of the two vertically disposed charge transfer channels in charge multiplexer 13. Electrodes 35 and 45 are dc-biased provide progressively lower potential energy level in the charge transfer channels. This is done to prohibit charge transfer from either of these charge transfer channels to the other rather than to floating diffusion 60. This is necessary because the right one of these two charge transfer channels is a half-stage longer than the other, so their output clocking is staggered. The portions of first-polysilicon-layer gate electrodes 42 and 41 (in FIG. 12) and of second-polysilicon-layer gate electrodes 32 and 33 overspanning the two vertically disposed charge transfer channels have steps from one of these charge transfer channels to the other to accommodate this half-stage difference in their respective lengths. The longer, rightmost of these two charge transfer channels has three gate electrodes 43, 34, 44 between gate electrodes 33 and 45 while the short, leftmost of these two charge transfer channels has only the single gate electrode provided by a portion of the gerrymandered gate electrode 42.

Referring back to FIG. 18, aluminum bus 55 ohmically contacts the floating diffusion, as defined by the overlap of the N+ diffusion 63 in FIG. 14 with the BCCD in FIG. 10, and connects it to the first-polysilicon-layer gate electrode 46 of the electrometer 6 FET, which electrode 46 appears in FIG. 12. First-polysilicon-layer gate electrode 47 is the reset gate electrode, ohmically contacted to top aluminization bus 56 of FIG. 18. Aluminum bus 57 ohmically contacts to the reset drain in the N+ diffusion 63 of FIG. 14. Aluminum bus 58 ohmically contacts a second-polysilicon-layer dc gate electrode 36 preceding the reset gate to shield the floating diffusion from reset feedthrough. Aluminum busses 50 and 59 contact the drain and source ends of the conduction channel of the electrometer FET. Aluminum busses 65 and 66 are used to establish substrate potentials.

Figure 19:
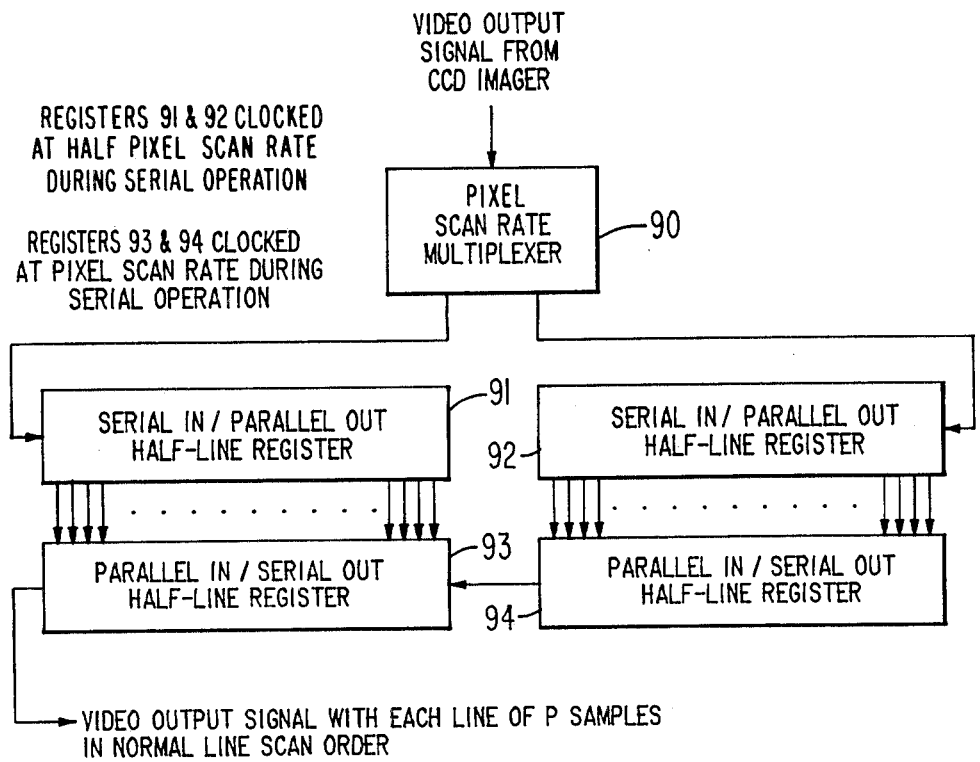
FIG. 19 is a block diagram of a representative scan conversion apparatus for use in connection with CCD imagers of the present invention.

FIG. 19 shows representative apparatus for de-multiplexing the output video signal samples from a CCD imager using the invention. It is assumed the imager is front-side illuminated, as is the case with the CCD linear sensor array of FIG. 2 or the interline transfer CCD imager of FIG. 4, though a generally similar de-multiplexer can be used for back-illuminated CCD imagers. A multiplexer 90 separates incoming video output signal samples on an alternating basis, alternation being at pixel scan rate, twice the forward clocking rate for output register halves 11 and 12 (or 11' and 12'). Through each line scan interval, those samples originating from charge packets transferred from output register half 11 or (11') are serially loaded into a first serial-in/parallel-out half-line register 91, and those samples originating from charge packets transferred from output register half 12 (or 12') are serially loaded into a second serial-in/parallel-out half-line register 92. The serial loading is clocked at one-half pixel scan rate, with a half-pixel offset in clocking phase in the two registers 91 and 92. Between line scan intervals half-line registers 91 and 92 transfer their contents in parallel to parallel-in/serial-out half-line registers 93 and 94, respectively. The half-line registers 93 and 94 are clocked in synchronism with each other, at pixel scan rate, during the ensuing line scan interval. Half-line register 93 is read out serially in reverse order that half-line register 91 was serially written into, to put the video samples involved in correct line order, rather than the reverse line order in which they were read out of the CCD imager. Half-line register 94 is read out serially in the same order that half-line register 92 was serially written into, preserving the correct line order these samples had when they were read out of the CCD imager. The serially unloaded samples from half-line register 94 are serially loaded into half-line register 93. So, the two half-line registers 93 and 94 operate as a full-line shift register during the line scan interval to deliver the full line of video output signal samples, P in number, in normal line scan order.

The fact that the successive-in-time samples of video output signal from the CCD imager are not generated responsive to image elements spatially adjacent to each other is the reason that the charge merging in charge multiplexer 13 of FIG. 2 imager, by way of example, must be done with such care. Line sensors may be made wherein one set of alternate ones of the photosensors is read out through a parallel transfer register to an output line register, both located on one side of the linear array of photosensors. The other set of alternate ones of the photosensor are read out through a parallel transfer register to an output line register, both located on the other side of the linear array of photosensors. The two output registers are forward clocked in parallel, but in staggered phasing, and the staggered-in-time charge packets are time-division-multiplexed to a shared electrometer. This approach is disadvantageous in that it places the electrometer in a position on the die that interferes with abutting a number of imagers, but this approach is advantageous in that some mingling of successive charge samples only results in some loss of resolution because successive samples are descriptive of adjacent image elements. In charge multiplexer 13 of the present invention, there can be no mingling of successive charge packets because successive-in-time samples are descriptive of image elements from opposite halves of the imager and so are less likely to be correlated in amplitude. This need to avoid mingling of charge packets from the two charge transfer channels supplying the shared electrometer 6 is the reason for a plurality of dc-biased gate electrodes 35, 45 being used to establish a strong drift field towards the floating diffusion of electrometer 6.

Suppose there is a transfer of a charge packet from under either of the first-polysilicon-layer gate electrodes 42, 44 to under the dc-biased second-polysilicon-layer gate electrode 35. The following, more positively dc-biased first-polysilicon-layer gate electrode 45 will have a lower potential energy level electrostatically induced thereunder, so the charge carriers in the transferred charge packet will flow under gate electrode 45 from under gate electrode 35. The less positively biased gate electrode 35 has a potential energy barrier thereunder for the charge flow in the other directions, from under gate electrode 45 to under gate electrode 35. So, charge flow is unconditionally in the one direction from under gate electrode 35 to under gate electrode 45 and thence to the electrometer 6.

What is claimed is:

1. A method for extracting signal from a plurality of charge-coupled-devices on the same semiconductor die, comprising the steps of:
   arranging the phases of similar-frequency clocking signals applied to the charge coupled devices such that charge packets transferred from their output ports are interleaved in timing;
   admitting the charge packets transferred from the output ports of said charge coupled devices to the input port of a charge transfer channel crossed by a plurality of successive gate electrodes and connected at its output port to an electrometer;
   dc biasing the plurality of successive gate electrodes to create a drift field in said charge transfer channel so charge transfer in the charge transfer channel is towards the electrometer;
   operating the electrometer at a sampling rate twice the frequency of said similar-frequency clocking signals; and
   de-multiplexing the output signal from said electrometer to provide separate responses to charge packets transferred out of the respective charge-coupled devices.

2. A CCD parallel-to-serial converter comprising:
   first and second parallel transfer CCD registers having respective pluralities of charge transfer channels with respective input ports and output ports, the input ports of said first and second parallel-transfer CCD registers being in parallel alignment with each other, the charge transfer channels in said first parallel-transfer CCD register having their output ports in parallel alignment with each other, and the charge transfer channels in said second parallel-transfer CCD register having their output ports in parallel alignment with each other, the parallel alignments of the output ports having separation therebetween but being at least substantially aligned with each other, said first and second parallel-transfer CCD register being clocked to transfer respective charge packets from their output ports in each of recurrent intervals;
   a first succession of charge transfer stages, at least earlier ones of which are side-loaded with charge packets transferred from respective ones of the output ports of the charge transfer channels in said first parallel transfer CCD register, said first succession of charge transfer stages being forward clocked only between said recurrent intervals, charge packets side-loaded during the most recent of said recurrent intervals being successively transferred from the last charge transfer stage in said first succession responsive to such forward clocking;
   a second succession of charge transfer stages, at least earlier ones of which are side-loaded with charge packets transferred through respective ones of the output ports of the charge transfer channels in said second parallel-transfer CCD register, said second succession of charge transfer stages being forward clocked only between said recurrent intervals, charge packets side-loaded during the most recent of said recurrent intervals being successively transferred from the last charge transfer stage in said second succession responsive to such forward clocking; and
   means for time-division multiplexing, in connections from the last charge transfer stages in said first and second successions of charge transfer stages to the output port of said CCD parallel-to-serial converter, charge packets successively transferred respectively from the last of said first succession of charge transfer stages and from the last of said second succession of charge transfer stages.

3. A CCD parallel-to-serial converter as set forth in claim 2 in combination with
   a single electrometer for sensing the amplitudes of all the charge packets successively transferred through the output port of said CCD parallel-to-serial converter.

4. A CCD parallel-to-serial converter as set forth in claim 2 wherein each of a number of periods of forward clocking of said first succession of charge transfer stages overlaps a different one of a number of periods of the forward clocking of said second succession of charge transfer stages, with the forward clocking of said first succession of charge transfer stages being at the same clocking rate as the forward clocking of said second succession of charge transfer stages, but with the phasings of the clocking applied to the last charge transfer stages of said first and second successions of charge transfer stages being staggered in time.

5. A CCD parallel-to-serial converter as set forth in claim 4 wherein said means for time-division multiplexing charge packets successively transferred respectively from the last of said first succession of charge transfer stages and the last of said second succession of charge transfer stages comprises:
   a merging of first and second charge transfer channels along which said first and second successions of charge transfer stages are respectively located;
   a succession of gate electrodes spanning said merging of said first and second charge transfer channels; and
   means for applying direct bias potentials to said succession of gate electrodes for transferring charge packets towards said output port of said CCD parallel-to-serial converter.

6. A CCD imager comprising CCD parallel-to-serial converter as set forth in claim 5 in combination with:
   a linear array of photosensors; and
   means for transferring charge packets from said photosensors to respective ones of the input ports of said first and second parallel-transfer CCD registers.

7. A CCD imager as set forth in claim 6 wherein said photosensors are Schottky barrier diode structures.

8. A CCD imager of interline transfer type comprising a CCD parallel-to-serial converter as set forth in claim 5 in combination with:
a field array of photosensing devices; and
an interline transfer CCD register associated with said field array of photosensing devices and provided with a plurality of output ports connected to respective ones of the input ports of said first and second parallel transfer CCD registers.

9. A CCD imager of field transfer type comprising a CCD parallel-to-serial converter as set forth in claim 5 in combination with:
an image register comprising a parallel array of charge transfer channels with respective output ports connecting to respective ones of the input ports of said first and second parallel-transfer CCD registers, each charge transfer channel in said image register including a plurality of successive charge transfer stages for accumulating charge packets responsive to respective elements of a radiant energy image, said first and second parallel-transfer CCD registers having in each of their charge transfer channels at least substantially as many charge transfer stages as in each charge transfer channel of said image register, and being operated as the field storage register of the CCD imager of field transfer type.

10. A CCD imager comprising a CCD parallel-to-serial converter as set forth in claim 2 in combination with:
a linear array of photosensors; and
means for transferring charge packets from said photosensors to respective ones of the input ports of said first and second parallel-transfer CCD registers.

11. A CCD parallel-to-serial converter as set forth in claim 10 in combination with
a single electrometer for sensing the amplitudes of all the charge packets successively transferred through the output port of said CCD parallel-to-serial converter.

12. A CCD imager as set forth in claim 10 wherein said photosensors are Schottky barrier diode structures.

13. A CCD imager of interline transfer type comprising a CCD parallel-to-serial converter as set forth in claim 2 in combination with:
a field array of photosensing devices; and
an interline transfer CCD register associated with said field array of photosensing devices and provided with a plurality of output ports connected to respective ones of the input ports of said first and second parallel transfer CCD registers.

14. A CCD parallel-to-serial converter as set forth in claim 13 in combination with
a single electrometer for sensing the amplitudes of all the charge packets successively transferred through the output port of said CCD parallel-to-serial converter.

15. A CCD imager of field transfer type comprising a CCD parallel-to-serial converter as set forth in claim 2 in combination with:
an image register comprising a parallel array of charge transfer channels with respective output ports connecting to respective ones of the input ports of said first and second parallel-transfer CCD registers, each charge transfer channel in said image register including a plurality of successive charge transfer stages for accumulating charge packets responsive to respective elements of a radiant energy image, said first and second parallel-transfer CCD registers having in each of their charge transfer channels at least substantially as many charge transfer stages as in each charge transfer channel of said image register, and being operated as the field storage register of the CCD imager of field transfer type.

16. A CCD parallel-to-serial converter as set forth in claim 15 in combination with
a single electrometer for sensing the amplitudes of all the charge packets successively transferred through the output port of said CCD parallel-to-serial converter.

17. A time-division-multiplexed electrometer comprising:
a first charge transfer channel segment having an input port and a terminal drain;
a floating diffusion disposed at a position in said first charge transfer channel segment;
an electrometer field effect transistor having a gate electrode connected via ohmic contact to said floating diffusion and having source and drain electrodes connected in a circuit from which output signal samples are serially supplied;
a reset electrode overspanning said first charge transfer channel segment at a position between said terminal drain and the position of said floating diffusion, to which reset pulses are applied at an output clock rate, whereby said terminal drain functions as a reset drain;
a plurality of gate electrodes overspanning said first charge transfer channel segment in successive positions between its input port and said floating diffusion, to which direct potentials are applied which induce a successively lower potential energy profile from the first charge transfer channel segment input port to the position of said floating diffusion;
second and third charge transfer channel segments being in parallel alignment along their lengths, having respective input ports, and having respective output ports in parallel array connecting to the input port of said first charge transfer channel segment;
a plurality of gate electrodes overspanning both said second and third charge transfer channel segments and being ohmically contacted on their sides to receive plural-phase forward clocking at one-half the output clock rate;
at least one further gate electrode overspanning only said third charge transfer channel segment and being ohmically contacted on a side thereof to be receptive of plural-phase forward clocking at one-half output clock rate and located after said plurality of gate electrodes overspanning both said second and third charge transfer channel segments, the phase of forward clocking at one-half output clock rate being applied to the final gate electrode overspanning said third charge transfer channel segment being staggered in time respective to the phase of forward clocking at one-half output clock rate being applied to the final gate electrode overspanning said second charge transfer channel segment, the gate electrodes overspanning said second and third charge transfer channels having respective pitches such that said second and third charge transfer channel segments have their input ports in parallel array respectively overspanned by gate electrodes connected for receiving the same phase of forward clocking at one-half output clock rate;

fourth and fifth charge transfer channel segments, having respective output ports connecting respectively to the input port of said second charge transfer channel segment and to the input port of said third charge transfer channel segment, having respective input ports, and being disposed in different directions so their input ports open in opposing directions;

a Y-shaped gate electrode, having its arms respectively overspanning said fourth charge transfer channel segment and said fifth charge transfer channel, and having its leg between said fourth and fifth charge transfer segments ohmically contacted to receive forward clocking voltage at one-half output clock rate;

an extension of the initial gate electrode overspanning said second and third charge transfer channel segments to overspan the portions of said fourth and fifth charge transfer channel segments between the arms of said Y-shaped gate electrode and the respective output ports of said fourth and fifth charge transfer channel segments;

a first wedge-shaped gate electrode overspanning said fourth charge transfer channel segment in a position next to its input port and preceding the arm of said Y-shaped gate electrode;

a second wedge-shaped gate electrode overspanning said fifth charge transfer channel segment in a position next to its input port and preceding the arm of said Y-shaped gate electrode; and means for applying the same phase of forward clocking voltage at one-half output clock rate to said first and second wedge-shaped gate electrodes, including means connecting them under the leg of said Y-shaped gate electrode and means for ohmically contacting the connected first and second wedge-shaped electrodes on a side of said fourth and fifth charge transfer channel segments remote from the side of said initial gate electrode overspanning said second and third charge transfer channel segments.

18. A time-division multiplexed electrometer as set forth in claim 17 in combination with:

first and second CCD shift registers, respectively including sixth and seventh charge transfer segments, which are in line with each other and terminate at output ports respectively connecting to a different one of the input ports of said fourth and fifth charge transfer channel segments, each of said first and second CCD shift registers having respective charge transfer stages side-loaded with respective charge packets between subsequent ones of scan intervals and clocked at one-half output clock rate during said recurrent scan intervals to successively transfer their respective charge packets to the output port of that one of said first and second CCD shift registers.

19. A combination as set forth in claim 18 being operative as an imager and towards that end further including:

a line array of photosensors consisting of a first half-line array and a second half-line array;

a first parallel-transfer CCD register having a parallel array of input ports connected from respective ones of said first half-line array of photosensors, having a parallel array of output ports connected to side-load respective ones of the charge transfer stages of said first CCD shift register, and being provided fan-in between the parallel arrays of its input ports and of its output ports; and a second parallel-transfer CCD register having a parallel array of input ports connected from respective ones of said second half-line array of photosensors, having a parallel array of output ports connected to side-load respective ones of the charge transfer stages of said second CCD shift register, and being provided fan-in between the parallel arrays of its input ports and its output ports.

20. A combination as set forth in claim 19 wherein said photosensors are Schottky barrier diode devices sensitive to infrared radiation.

* * * * *